(12) United States Patent
Park et al.

(10) Patent No.: US 8,143,099 B2
(45) Date of Patent: Mar. 27, 2012

(54) METHOD OF MANUFACTURING SEMICONDUCTOR PACKAGE BY ETCHING A METAL LAYER TO FORM A REARRANGEMENT WIRING LAYER

(75) Inventors: Seung Wook Park, Suwon-si (KR); Jin Gu Kim, Suwon-si (KR); Jong Hwan Baek, Seoul (KR); Jong Yun Lee, Incheon-si (KR); Hyung Jin Jeon, Gunpo-si (KR); Young Do Kweon, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 39 days.

(21) Appl. No.: 12/453,274

(22) Filed: May 5, 2009

(65) Prior Publication Data
US 2010/0144152 A1 Jun. 10, 2010

(30) Foreign Application Priority Data
Dec. 8, 2008 (KR) .................. 10-2008-0124003

(51) Int. Cl.
*H01L 21/00* (2006.01)
(52) U.S. Cl. . 438/108; 438/112; 257/778; 257/E21.503; 257/E21.511

(58) Field of Classification Search .......... 438/106–127; 257/678, 686, 690, 778, E21.499, E21.503, 257/E21.511, E33.001
See application file for complete search history.

(56) References Cited

U.S. PATENT DOCUMENTS

| | | | |
|---|---|---|---|
| 2002/0094606 A1* | 7/2002 | Fukutomi et al. | 438/110 |
| 2004/0106288 A1* | 6/2004 | Igarashi et al. | 438/689 |
| 2007/0114661 A1* | 5/2007 | Choi et al. | 257/737 |
| 2009/0170241 A1* | 7/2009 | Shim et al. | 438/107 |

FOREIGN PATENT DOCUMENTS
KR 1020070007002 1/2007
* cited by examiner

*Primary Examiner* — Khiem D Nguyen

(57) ABSTRACT

The present invention relates to a method of manufacturing a semiconductor package capable of simplifying a process and remarkably reducing a production cost by including the steps of: preparing a different bonded panel including at least one metal layer; forming a pad unit electrically connected to the metal layer; mounting a semiconductor chip over the different bonded panel to be electrically connected to the pad unit; sealing the semiconductor chip; forming a rearrangement wiring layer by etching the metal layer; and forming an external connection unit electrically connected to the rearrangement wiring layer.

12 Claims, 8 Drawing Sheets

[FIG. 1]
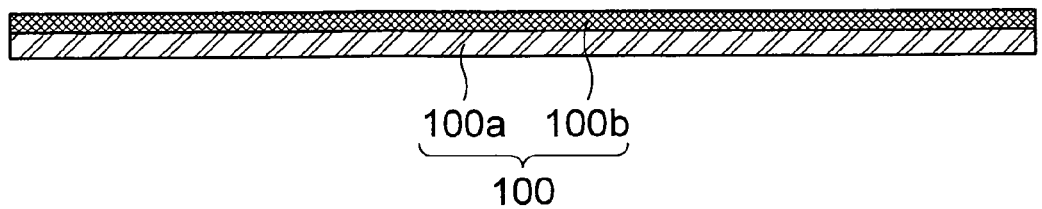
100a 100b
  └─┬─┘
   100
[FIG. 2]
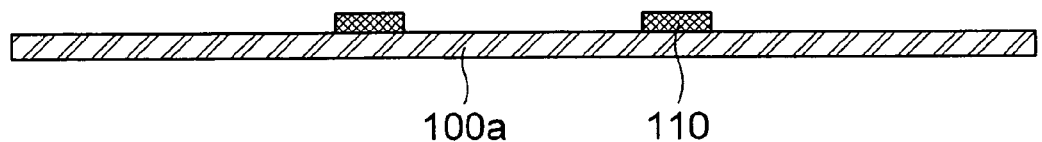
100a   110
[FIG. 3]
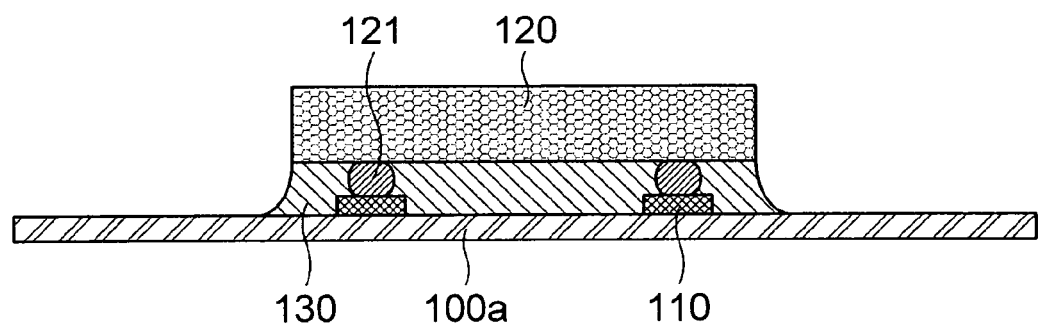
121  120
130  100a  110
[FIG. 4]
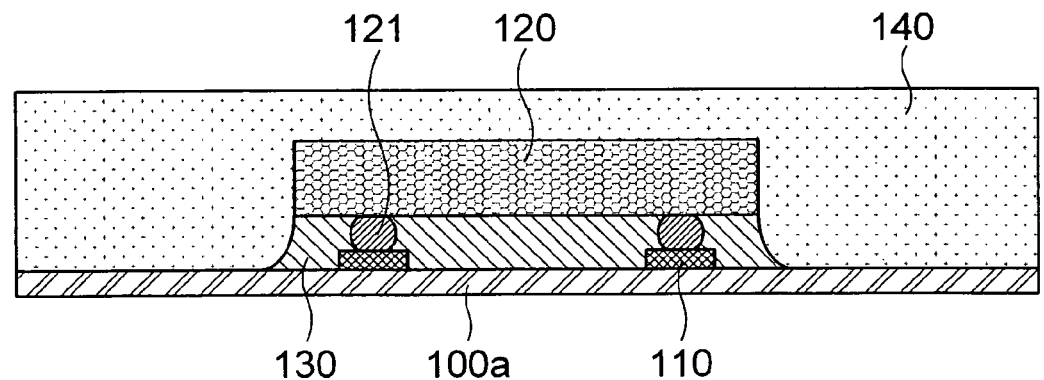
121  120  140
130  100a  110

[FIG. 5]
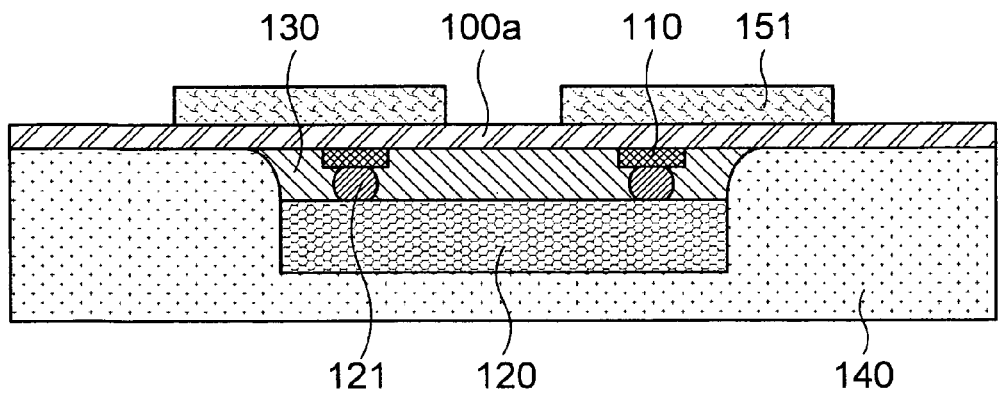
[FIG. 6]
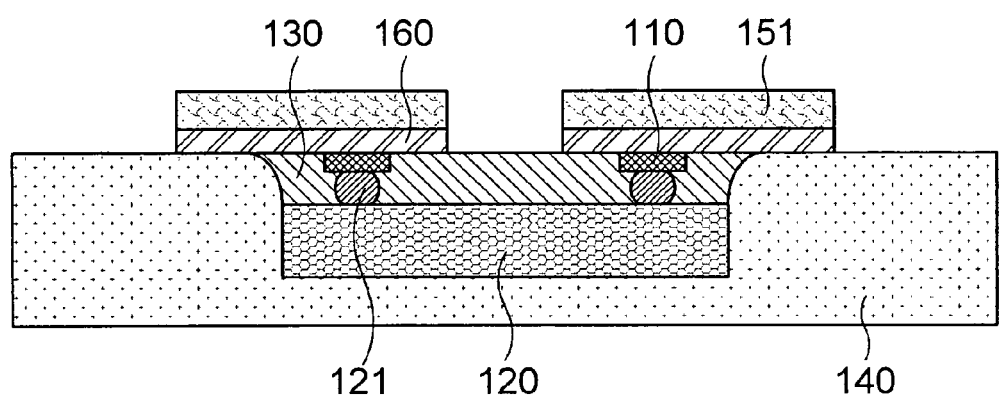
[FIG. 7]
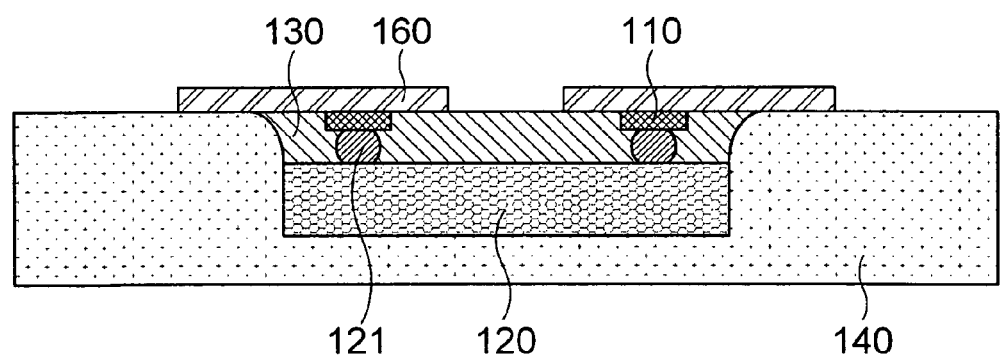

[FIG. 8]
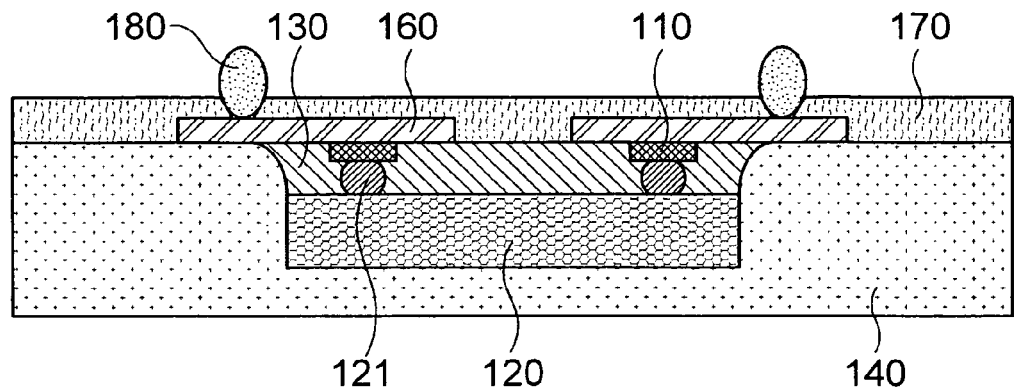
[FIG. 9]
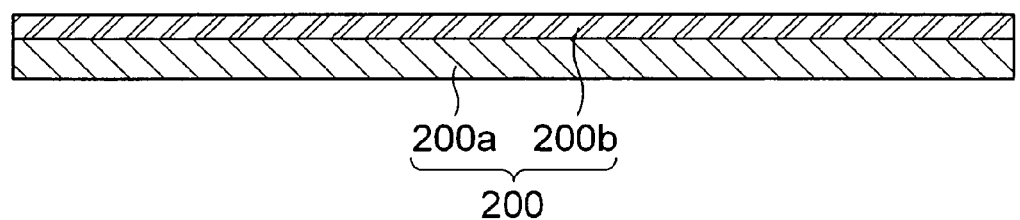
[FIG. 10]
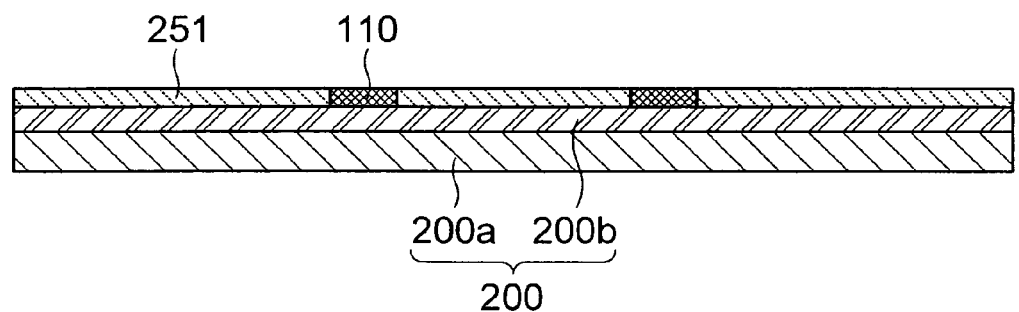
[FIG. 11]
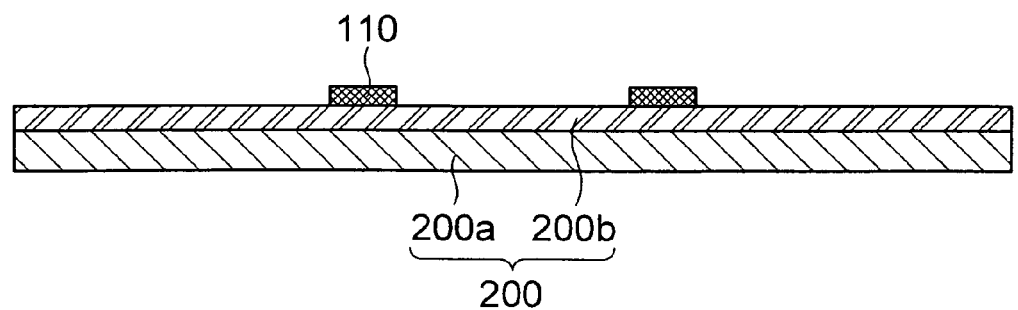

[FIG. 12]
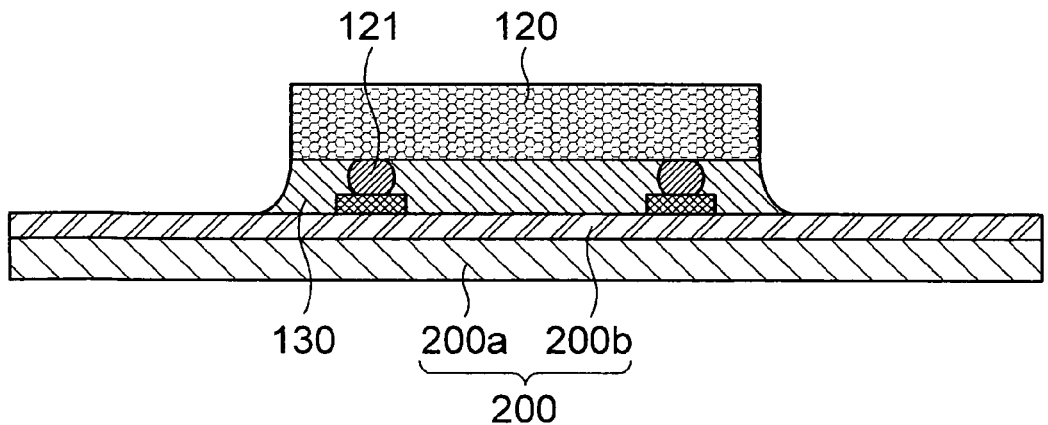
[FIG. 13]
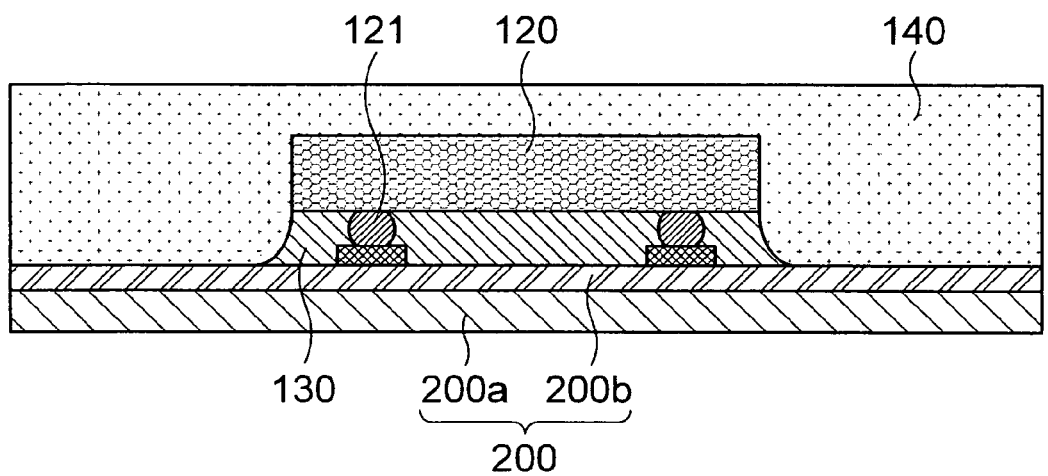
[FIG. 14]
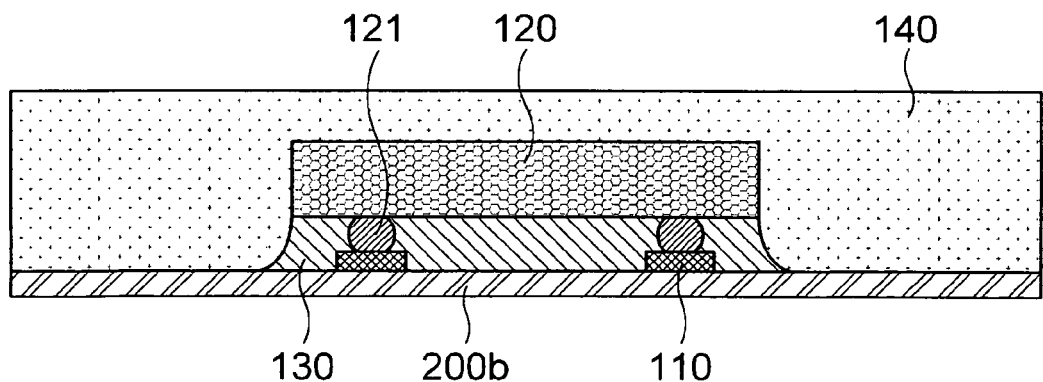

[FIG. 15]
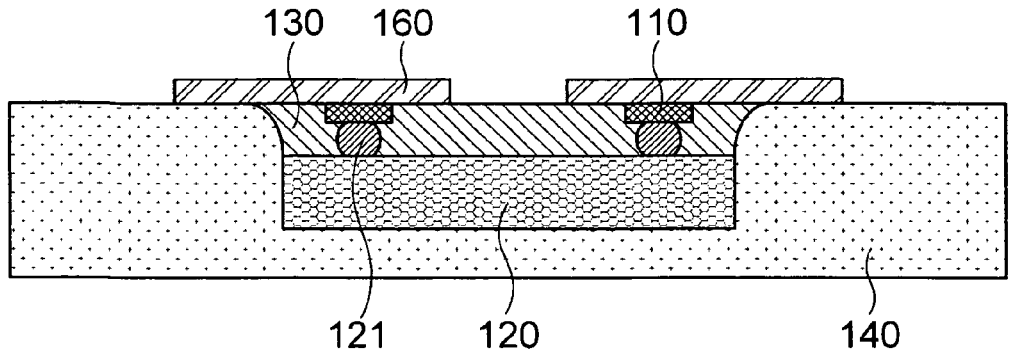
[FIG. 16]
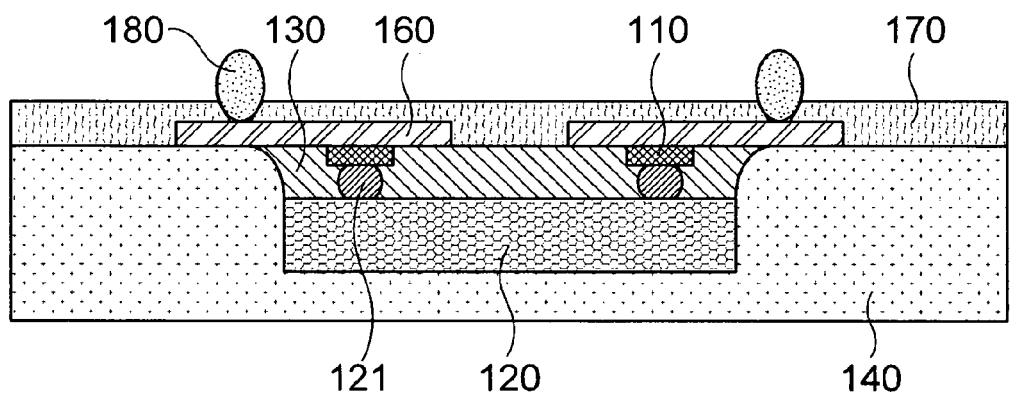
[FIG. 17]
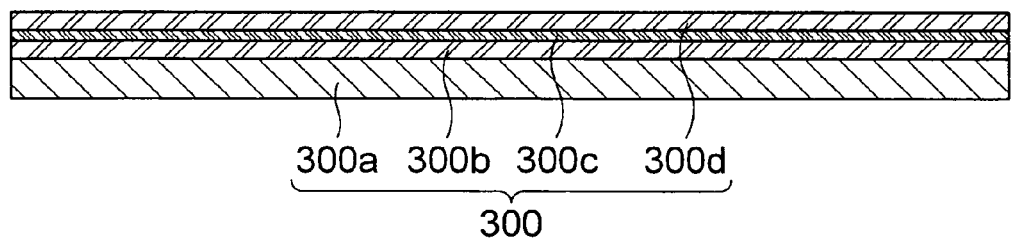
[FIG. 18]
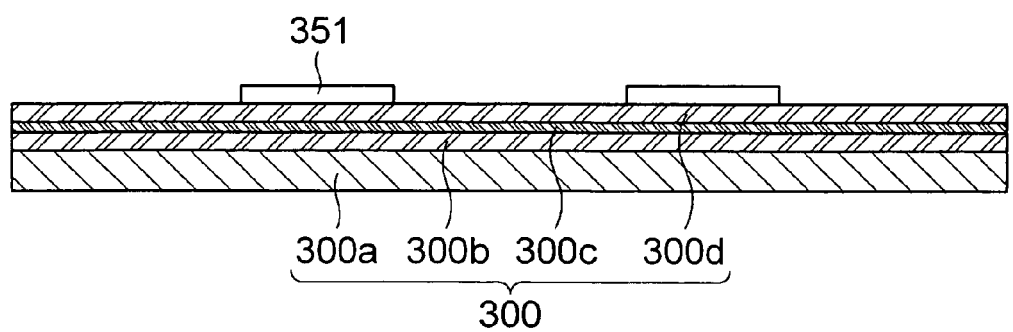

[FIG. 19]
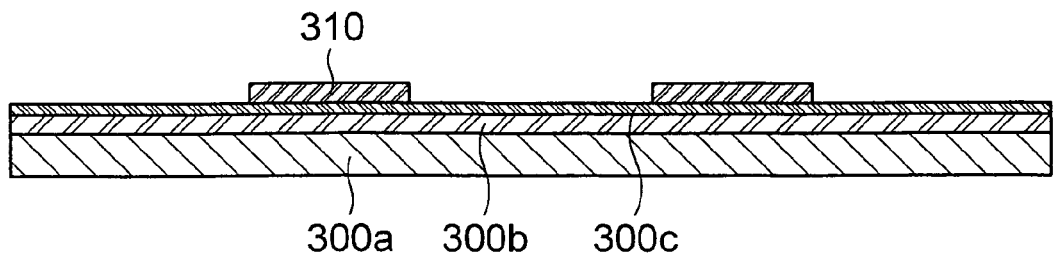
[FIG. 20]
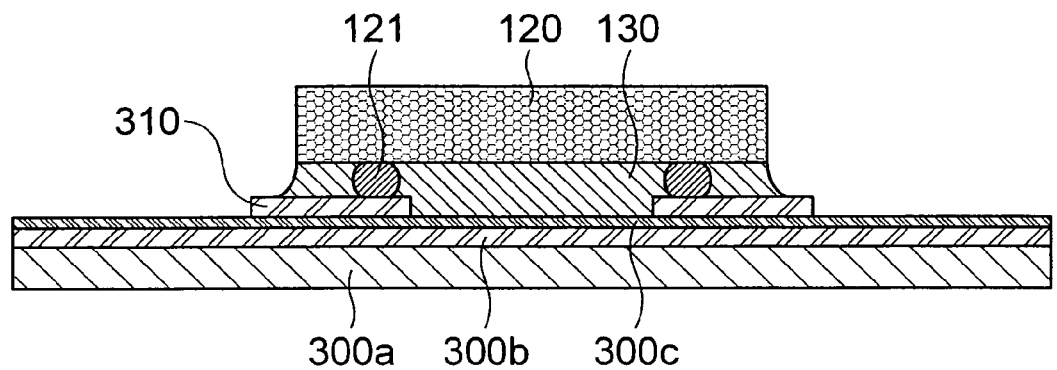
[FIG. 21]
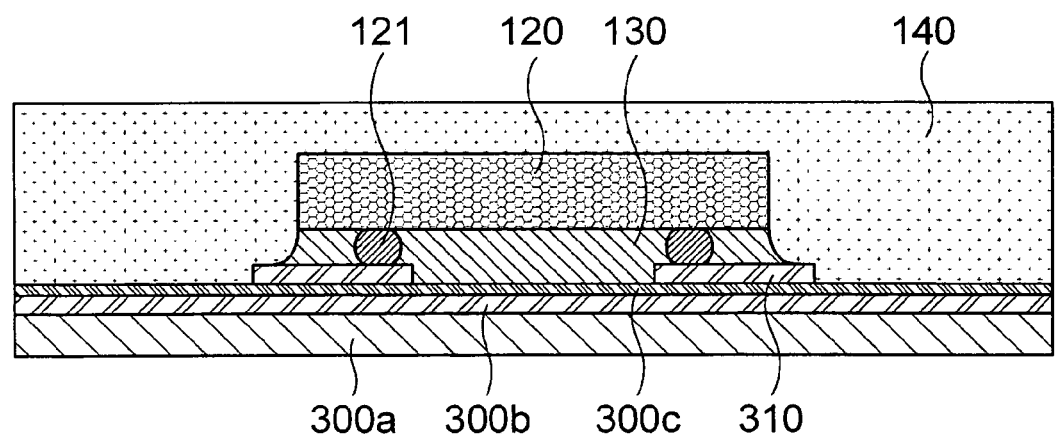

[FIG. 22]
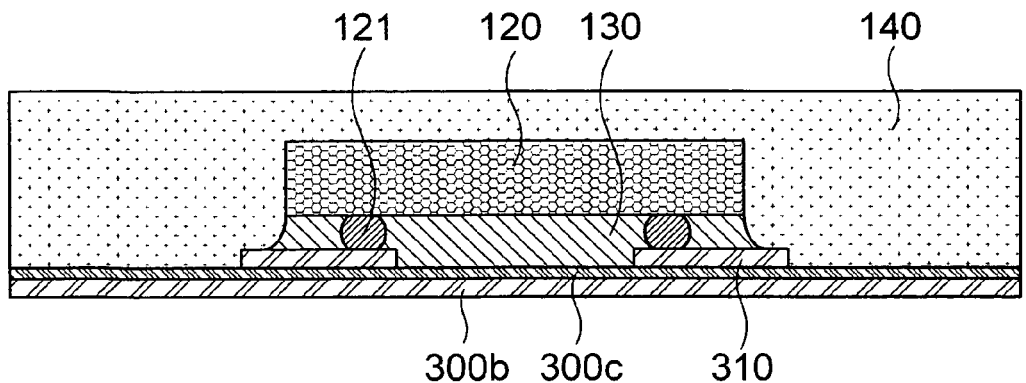
[FIG. 23]
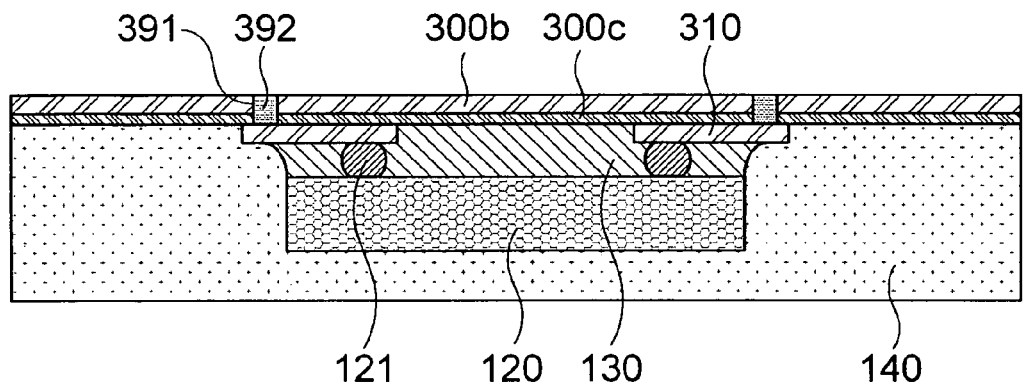
[FIG. 24]
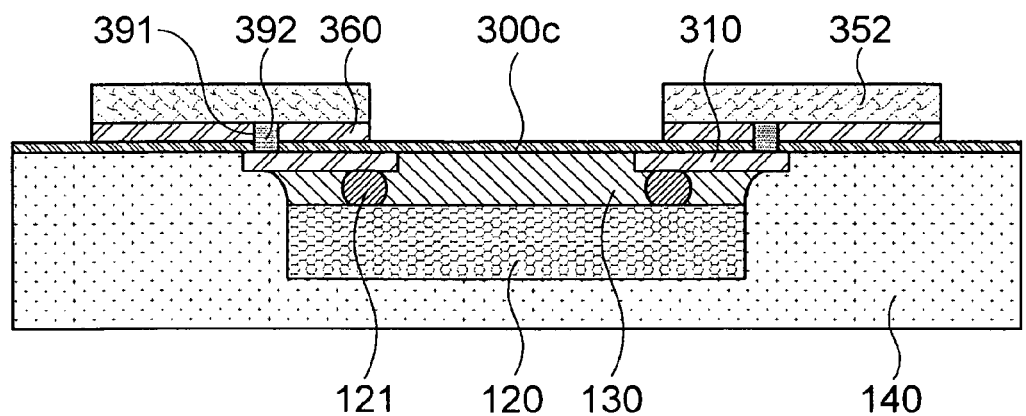

[FIG. 25]
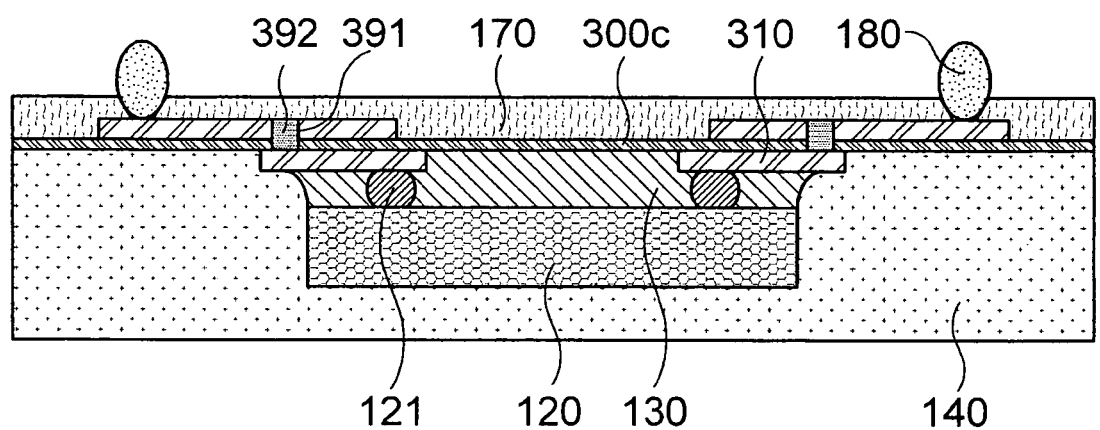

METHOD OF MANUFACTURING SEMICONDUCTOR PACKAGE BY ETCHING A METAL LAYER TO FORM A REARRANGEMENT WIRING LAYER

CROSS-REFERENCE TO RELATED APPLICATIONS

This application claims the benefit of Korean Patent Application No. 10-2008-0124003 filed with the Korea Intellectual Property Office on Dec. 8, 2008, the disclosure of which is incorporated herein by reference.

BACKGROUND OF THE INVENTION

1. Field of the Invention

The present invention relates to a method of manufacturing a semiconductor package; and, more particularly, to a method of manufacturing a semiconductor package to form a rearrangement wiring layer by etching a metal layer after forming a pad unit on the metal layer with a different bonded panel including at least one metal layer and mounting a semiconductor chip electrically connected to the pad unit.

2. Description of the Related Art

A recent trend of an electronic industry is to manufacture a product which is lighter, miniaturized, high-speed, multi-functional and high-performance and has high reliability at a low cost. One of important technologies for achieving an object to deign the product is a semiconductor package.

The semiconductor package as a technology for effectively packaging a device used in an electronic product has been developed in various types because it is a technology to decide a performance of a semiconductor element and a cost, a performance and reliability of a final product.

The semiconductor package has been manufactured by a flip chip method using a bump ball technology for electrical connection between semiconductor chips or the semiconductor chip and a substrate. In the bump ball technology, there is a problem that the number of input and output pads of the package and a size of the chip are limited due to a limit in fining a bump ball. In other words, if miniaturization of the semiconductor chip or the number of the input and output pads is increasing, there is a limit to the package in that all of the bump balls as final input and output terminals can not be received in a top surface of the semiconductor chip.

In order to improve the above problem, there has been developed the package with an embedded structure for mounting the semiconductor chip inside a circuit board, a fan-out structure for positioning the bump ball as the final input and output terminal of the semiconductor chip at an outer circumferential surface of the semiconductor chip, or the like.

Herein, the package with the embedded structure or the fan-out structure is manufactured by a build-up method in which a metal layer is built up from an electric contact pattern of the semiconductor chip after mounting the semiconductor chip. However, the build-up method has problems in that a package process is complicated and a production cost is increasing since a layer stacking process, a via hole forming process for interlayer connection, or the like should be performed.

Further, in the build-up method, particularly, a cure process and a stacking process, CTE (Coefficient of Thermal Expansion) mismatch and warpage between a wafer substrate and the semiconductor chip are caused, which leads to misalignment in case that a fine pitch chip is mounted.

SUMMARY OF THE INVENTION

The present invention has been invented in order to overcome the above-described problems and it is, therefore, an object of the present invention to provide a method of manufacturing a semiconductor package capable of simplifying a process and reducing a production cost by etching a metal layer to form a rearrangement wiring layer after forming a pad unit on the metal layer with a different bonded panel including at least one metal layer and mounting a semiconductor chip electrically connected to the pad unit.

In accordance with one aspect of the present invention to achieve the object, there is provided a method of manufacturing a semiconductor package including the steps of: preparing a different bonded panel including at least one metal layer; forming a pad unit electrically connected to the metal layer; mounting a semiconductor chip over the different bonded panel to be electrically connected to the pad unit; sealing the semiconductor chip; forming a rearrangement wiring layer by etching the metal layer; and forming an external connection unit electrically connected to the rearrangement wiring layer.

Herein, the different bonded panel can further include an additional metal layer which is positioned on the metal layer and has a different etching selection ratio from an etching selection ratio of the metal layer.

Further, the pad unit can be formed by etching the additional metal layer.

Further, the different bonded panel further includes a wafer substrate positioned at a lower part of the metal layer and the wafer substrate is removed after the step of sealing the semiconductor chip.

Further, the pad unit can be formed on the metal layer by a vacuum deposition method or a plating method.

Further, the different bonded panel further includes a core layer positioned on the metal layer and an additional metal layer formed on the core layer and the method further includes a step of forming a via for connecting the additional metal layer and the pad unit on the core layer after the step of sealing the semiconductor chip.

Further, an additional rearrangement wiring layer is formed in the step of forming the pad unit.

In accordance with another aspect of the present invention to achieve the object, there is provided a method of manufacturing a semiconductor package including the steps of: preparing a different bonded panel including first and second stacked metal layers; forming a pad unit by etching the second metal layer; mounting a semiconductor chip to be connected to the pad unit; sealing the semiconductor chip; forming a rearrangement wiring layer by etching the first metal layer; and forming an external connection unit electrically connected to the rearrangement wiring layer.

Herein, the method can further include a step of forming an insulation pattern to expose a portion of the rearrangement wiring layer before the step of forming the external connection unit.

Further, the first and second metal layers can have different etching selection ratios from each other.

Further, the semiconductor chip can be mounted by using any one of soldering, conductive paste, NCP (Non-Conductive Paste) and ACF (Anisotropic Conductive Film).

Further, the different bonded panel further includes a wafer substrate positioned at a lower part of the first metal layer and the wafer substrate can be removed in the step of sealing the semiconductor chip and the step of forming the rearrangement wiring layer.

Further, the different bonded panel can further include a core layer interposed between the first and second metal layers.

Further, the method further includes steps of forming a via hole on the core layer before the step of forming the rearrangement wiring layer; and forming a via filled in the via hole and electrically connected to the first metal layer.

In accordance with another aspect of the present invention to achieve the object, there is provided a method of manufacturing a semiconductor package including the steps of: preparing a different bonded panel including stacked metal layer and wafer substrate; forming a pad unit on the metal layer; mounting a semiconductor chip to be connected to the pad unit; sealing the semiconductor chip; removing the wafer substrate; forming a rearrangement wiring layer by etching the metal layer; and forming an external connection unit electrically connected to the rearrangement wiring layer.

Herein, the pad unit can be formed on the metal layer by a vacuum deposition method or a plating method Further, the different bonded panel can further include an additional metal layer which is positioned on the metal layer and has a different etching selection ratio from an etching selection ratio of the metal layer.

Further, the pad unit can be formed by etching the additional metal layer.

Further, the different bonded panel further includes a core layer positioned on the metal layer and an additional metal layer positioned on the core layer.

Further, the pad unit can be formed by etching the additional metal layer.

Further, an additional rearrangement layer is formed in the step of forming the pad unit.

Further, the method can further include steps of forming a via hole on the core layer before the step of forming the rearrangement wiring layer; and forming a via filled in the via hole and electrically connected to the metal layer before the step of forming the rearrangement wiring layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1 to 8 are cross-sectional views illustrating a method of manufacturing a semiconductor package in accordance with a first embodiment of the present invention;

FIGS. 9 to 16 are cross-sectional views illustrating a method of manufacturing a semiconductor package in accordance with a second embodiment of the present invention; and FIGS. 17 to 25 are cross-sectional views illustrating a method of manufacturing a semiconductor package in accordance with a third embodiment of the present invention.

DETAILED DESCRIPTION OF THE PREFERABLE EMBODIMENTS

Hereinafter, embodiments of the present invention will be described in detail with reference to the accompanying drawings illustrating a semiconductor package. The following embodiments are provided as examples to allow those skilled in the art to sufficiently appreciate the spirit of the present invention. Therefore, the present invention can be implemented in other types without limiting to the following embodiments. And, for convenience, the size and the thickness of an apparatus can be overdrawn in the drawings. The same components are represented by the same reference numerals hereinafter.

FIGS. 1 to 8 are cross-sectional views illustrating a method of manufacturing a semiconductor package in accordance with a first embodiment of the present invention Referring to FIG. 1, to manufacture the semiconductor package, at first, a different bonded panel 100 is prepared.

Herein, the different bonded panel 100 can include first and second stacked metal layers 100a and 100b. The first metal layer 100a can include any one of aluminum (Al), tungsten (W), plumbum (Pb), stibium (Sb), chromium (Cr), nickel (Ni), silver (Ag), gold (Au), and copper (Cu). Further, the second metal layer 100b can include any one of silver (Ag), gold (Au), and copper (Cu). At this time, the first and second metal layers 100a and 100b should be made of material with different etching selection ratios. For instance, if the first metal layer 100a is made of aluminum, the second metal layer 100b can be made of copper.

Referring to FIG. 2, the second metal layer 100b is etched in order to form pad units 110. The pad units 110, although not shown in the drawing, can be formed by forming resist patterns with a predetermined pattern on the second metal layer 100b and etching the second metal layer 100b through an etching process where the resist patterns are used as an etching mask.

At this time, since the first metal layer 100a has a different etching selection ratio from that of the second metal layer 100b, it is not etched in the etching process of the second metal layer 100b.

Referring to FIG. 3, a semiconductor chip 120 is mounted over the different bonded panel 100 to be electrically connected to the pad units 110. Herein, the semiconductor chip 120 can be electrically connected to the pad units 110 by a flip chip bonding method. In other words, the semiconductor chip 120 and the pad units 110 can be electrically connected to each other by adhering and soldering connection units 121 of the semiconductor chip, e.g., bump balls to the pad units 110.

Thereafter, an under fill 130 is formed to cover at least a connection portion of the semiconductor chip 120 and the pad units 110. The under fill 130 can be formed by filling under fill resin between the semiconductor chip 120 and the first metal layer 100a. Herein, the under fill 130 can improve fatigue life of the bump balls by reducing thermal stress applied to the bump balls in a soldering process. Accordingly, it is possible to enhance reliability of the electric connection between the semiconductor chip 120 and the pad units 110. Herein, as examples of material used as the under fill resin, there are epoxy resin, polyimide resin, polyacrylate resin, polyester resin, polybenzoxazole resin, and so on.

Although in the embodiment of the present invention, the connection portion between the semiconductor chip 120 and the pad units 110 is explained for a case that it is covered by the under fill 130, it is not limited to this. For example, as a sealing member 140 formed in a subsequent process instead of the under fill 130 is formed to cover the connection portion between the semiconductor chip 120 and the pad units 110, the sealing member 140 can play a role of the under fill 130. That is, since the sealing member 140 plays the role of the under fill 130, an additional under fill 130 may not be formed.

Further, although a method of mounting the semiconductor chip 120 is explained by limiting to the flip chip bonding method using soldering, it is not limited to this. For example, other methods of mounting the semiconductor chip can use conductive paste, ACF (Anisotropic Conductive Film) and liquid NCP (Non-Conductive Paste), and so on. Herein, in the method of mounting the semiconductor chip 120, if the ACF is used, the semiconductor chip 120 and the pad units 110 can be electrically connected to each other by interposing the ACF between the connection units 121 of the semiconductor chip 120 and the pad units 110. Further, in the method of mounting the semiconductor chip 120, if the NCP is used, the NCP is not interposed between the connection units 121 of the semiconductor chip 120 and the pad units 110 but it is positioned around the electric connection portions between the connection units 121 of the semiconductor chip 120 and the pad units 110 in order to adhere and fix the semiconductor chip 120 to the first metal layer 100a. At this time, the NCP can play a role of the under fill which can enhance the reliability of the electric contact between the semiconductor chip 120 and the first metal layer 100a.

Referring to FIG. 4, the sealing member 140 is formed to seal the semiconductor chip 120. At this time, the sealing member 140 can be formed to cover the under fill 130. Herein, the sealing member 140 protects the semiconductor chip 120 against an external environment by sealing the semiconductor chip 120. Herein, as examples of a method of forming the sealing member 140, there are a transfer molding method, an injection molding method, a screen printing method, a dispensing method, and so on. Further, the sealing member 140 is made of resin, e.g., epoxy resin, silicon resin, fluorine resin, and acryl resin.

Referring to FIG. 5, resist patterns 151 are formed at a lower part of the first metal layer 100a. In order to form the resist patterns 151, a resist layer is formed by coating the lower part of the first metal layer 100a with photoresist or laminating DFR (Dry Film Resist) at the lower part of the first metal layer 100a. Thereafter, the resist patterns 151 can be formed by exposing and developing the resist layer.

Rearrangement wiring layers 160 are formed as shown in FIG. 6 by etching the first metal layer 100a by using the resist patterns 151 as an etching mask. Thereafter, as shown in FIG. 7, the resist patterns 151 are removed.

Referring to FIG. 8, an insulation pattern 170 is formed on the rearrangement wiring layers 160. The insulation pattern 170 exposes portions of the rearrangement wiring layers 160. The insulation pattern 170 can be formed through exposure and development processes after forming an insulation layer. However, in the embodiment of the present invention, a method of forming the insulation pattern 170 is limited to this.

The insulation pattern 170 can play a role of resist in a process of forming external connection units 180 as a subsequent process. In other words, the insulation pattern 170 prevents undesired connection due to soldering in mounting an external element by covering the rearrangement wiring layers 160. That is, the insulation pattern 170 plays a role of protective material for protecting the rearrangement wiring layers 160 of the semiconductor package and a role of giving insulating property between circuits.

The external connection units 180 are formed on the rearrangement wiring layers 160 exposed by the insulation pattern 170. Herein, as examples of the external connection units 180, there are a solder ball, a metal bump, and so on.

Therefore, in the method of manufacturing the semiconductor package in accordance with the embodiment of the present invention, it is possible to simplify a process without the need to perform additional stacking process and via hole forming process by performing a build-up process through a photo process where the metal layer constituting the different bonded panel is etched after mounting the semiconductor chip on the different bonded panel.

Further, it is possible to prevent connection failure due to misalignment of the semiconductor chip by etching the metal layer to form the rearrangement wiring layer after previously mounting the semiconductor chip over the metal layer for forming the rearrangement wiring layer.

Hereinafter, a method of manufacturing a semiconductor package using a different kind of different bonded panel in accordance with a second embodiment will be described with reference to drawings. Herein, in the second embodiment, overlapping description with the first embodiment will not be repeated and the same component is represented by the same reference numeral.

FIGS. 9 to 16 are cross-sectional views illustrating the method of manufacturing the semiconductor package in accordance with the second embodiment of the present invention.

Referring to FIG. 9, to manufacture the semiconductor package, at first, a different bonded panel 200 is prepared.

Herein, the different bonded panel 200 can include a metal layer 200b and a wafer substrate 200a positioned at a lower part of the metal layer 200b. As examples of material of the metal layer 200b, there are aluminum (Al), tungsten (W), plumbum (Pb), stibium (Sb), chromium (Cr), nickel (Ni), silver (Ag), gold (Au), copper (Cu), and so on. As examples of material of the wafer substrate 200a, there are silicon, ceramic, glass, polymer, and so on.

Referring to FIG. 10, first resist patterns 251 are formed on the metal layer 200b. To form the first resist patterns 251, at first, a resist layer is formed by coating the metal layer 200a with photoresist or laminating DFR (Dry Film Resist) on the metal layer 200b. Thereafter, the first resist patterns 251 can be formed by exposing and developing the resist layer. Pad units 110 are formed on the metal layer 200b exposed by the first resist patterns 251. The pad units 110 can be formed by a plating method. Or, the pad units 110 can be formed by a vacuum deposition method using a mask. Thereafter, the first resist patterns 251 are removed as shown in FIG. 11 after forming the pad units 110.

Although in the embodiment of the present invention, the pad units 110 are explained through the vacuum deposition method or the plating method, they are not limited to this. For instance, the pad units 110 can be formed through an etching process using a photo process of an additional metal layer by using a different bonded panel including the additional metal layer having a different etching selection ratio from that of the metal layer 220b on the metal layer 200b.

Referring to FIG. 12, a semiconductor chip 120 is mounted over the different bonded panel 200 to be electrically connected to the pad units 110. Herein, the semiconductor chip 120 can be mounted by a flip chip bonding method using soldering of a bump ball. However, in the embodiment of the present invention, the mounting of the semiconductor chip 120 is not limited to this and the semiconductor chip 120 can also be mounted by using any one of conductive paste, NCP (Non-Conductive Paste) and ACF (Anisotropic Conductive Film).

In addition, in order to improve contact reliability of the semiconductor chip 120, an under fill 130 can be formed between the semiconductor chip 120 and the different bonded panel 200 to cover at least a connection portion between the semiconductor chip 120 and the pad units 110.

Referring to FIG. 13, a sealing member 140 is formed to seal the semiconductor chip 120. Herein, as examples of a method of forming the sealing member 140, there are a transfer molding method, an injection molding method, a screen printing method, a dispensing method, and so on. Further, the sealing member 140 is made of resin, e.g., epoxy resin, silicon resin, fluorine resin, and acryl resin.

Referring to FIG. 14, after forming the sealing member 140, the wafer substrate 200a is removed from the metal layer 200b. In one method of removing the wafer substrate 200a, the wafer substrate 200a can be decomposed through a polishing or wet process.

In another method of removing the wafer substrate 200a, although not shown in the drawings, a sacrificial layer is formed between the wafer substrate 200a and the metal layer 200b and then the sacrificial layer is removed through a wet process or UV irradiation in order to separate the wafer substrate 200a from the metal layer 200b. At this time, the sacrificial layer is formed on the wafer substrate 200a before forming the metal layer 200b. Herein, the sacrificial layer can be formed with any one of metal, silicon oxide, silicon nitride and ultraviolet light degradable resin.

Referring to FIG. 15, rearrangement wiring layers 160 are formed by etching the metal layer 200b exposed by removing the wafer substrate 200a. Namely, in order to form the rearrangement wiring layers 160, although not shown in the drawing, at first, second resist patterns are formed on the metal layer. Thereafter, the rearrangement wiring layers 160 can be formed through an etching process of the metal layer where the second resist patterns are used as an etching mask.

Referring to FIG. 16, an insulation pattern 170 is formed on the rearrangement wiring layers 160. Thereafter, external connection units 180, e.g., solder balls and metal bumps are formed on the rearrangement wiring layers 160 exposed by the insulation pattern 170.

Therefore, in the method of manufacturing the semiconductor package in accordance with the embodiment of the present invention, it is possible to simplify a process without the need to perform additional stacking process and via hole forming process by performing a build-up process through a photo process for etching the metal layer constituting the different bonded panel after mounting the semiconductor chip on the different bonded panel.

Further, it is possible to prevent connection failure due to misalignment of the semiconductor chip by etching the metal layer to form the rearrangement wiring layers after previously mounting the semiconductor chip over the metal layer for forming the rearrangement wiring layers.

Further, the semiconductor package can enable mass production and improve productivity by performing a packaging process in a wafer state, thereby dramatically reducing a manufacture cost.

Hereinafter, a method of manufacturing a semiconductor package using still another kind of different bonded panel in accordance with a third embodiment will be described with reference to drawings. Herein, in the third embodiment, overlapping description with the second embodiment will not be repeated and the same component is represented by the same reference numeral.

FIGS. 17 to 25 are cross-sectional views illustrating a method of manufacturing a semiconductor package in accordance with a third embodiment of the present invention.

Referring to FIG. 17, to manufacture the semiconductor package, at first, a different bonded panel 300 is prepared.

Herein, the different bonded panel 300 can include a CCL (Copper Clad Laminate) layer, i.e., a first metal layer 300b, a core layer 300c, and a second metal layer 300d which is positioned on a wafer substrate 300a.

The first metal layer 300b and the second metal layer 300d can be made of copper. The core layer 300c can be made of insulating material. Herein, as examples of the insulating materials, there are silicon resin, epoxy resin, phenolic resin, and so on. However, in the embodiment of the present invention, the material of the first and second metal layers 300b and 300d and the core layer 300c is not limited to this.

Although in the embodiment of the present invention, the different bonded panel 300 includes the wafer substrate 300a, the different bonded panel 300 may not include the wafer substrate 300a like that of the above-described first embodiment.

Referring to FIG. 18, first resist patterns 351 are formed on the second metal layer 300d. To form the first resist patterns 351, at first, a resist layer is formed by coating the second metal layer 300d with photoresist or laminating DFR (Dry Film Resist) on the second metal layer 300d. Thereafter, the first resist patterns 351 can be formed by exposing and developing the resist layer.

Referring to FIG. 19, first rearrangement wiring layer 310 including pad units can be formed by removing the first resist patterns 351 after etching the second metal layer 300d by using the first resist patterns 351 as an etching mask.

Referring to FIG. 20, a semiconductor chip 120 is mounted on the different bonded panel 300 to be electrically connected to the first rearrangement wiring layers 310, particularly the pad units. Herein, the semiconductor chip 120 can be mounted by a flip chip bonding method using soldering of a bump ball. However, in the embodiment of the present invention, the mounting of the semiconductor chip is not limited to this and the semiconductor chip 120 can also be mounted by using any one of conductive paste, NCP (Non-Conductive Paste) and ACF (Anisotropic Conductive Film).

In addition, in order to improve contact reliability of the semiconductor chip 120, an under fill 130 can be further formed between the semiconductor chip 120 and the different bonded panel 300 to cover at least connection portions between the semiconductor chip 120 and the pad units 110.

Referring to FIG. 21, a sealing member 140 is formed to seal the semiconductor chip 120 and then as shown in FIG. 22, the wafer substrate 300a is removed from the first metal layer 300b. As a method of removing the wafer substrate 300a, there is used a wafer substrate decomposing method using a polishing method and a wet process or a wafer substrate separating method using a sacrificial layer which is removed by a wet process or UV irradiation.

Referring to FIG. 23, via holes 391 are formed on the first metal layer 300b exposed by removing the wafer substrate 300a and the core layer 300c. Herein, as example of a method of forming the via holes 391, there are used a mechanical drill method, a laser drill method, a photo process, and so on.

Thereafter, vias 392 are formed which are electrically connected to the first rearrangement wiring layers 310 exposed by the via holes 391. That is, the vias 392 can electrically connect the first rearrangement wiring layers 310 and the first metal layer 300b to each other. Further, the first metal layer 300b and the pad units can be electrically connected to each other through the vias 392. Herein, the vias 392 can be formed by a plating process or a conductive paste filling process.

Referring to FIG. 24, second resist patterns 352 are formed on the first metal layer 300b. Second rearrangement wiring layers 360 can be formed by etching the first metal layer 300b by using the second resist patterns 352 as an etching mask.

Referring to FIG. 25, an insulation pattern 170 is formed on the second rearrangement wiring layers 360. Thereafter, external connection units 180, e.g., solder balls and metal bumps are formed on the second rearrangement wiring layers 360 exposed by the insulation pattern 170.

Therefore, in the method of manufacturing the semiconductor package in accordance with the embodiment of the present invention, it is possible to simplify a process without the need to perform additional stacking process and via hole forming process by performing a build-up process through a photo process for etching the metal layer constituting the different bonded panel after mounting the semiconductor chip over the different bonded panel.

Further, it is possible to prevent connection failure due to misalignment of the semiconductor chip by forming the rearrangement wiring layers by etching the metal layer after previously mounting the semiconductor chip over the metal layer for forming the rearrangement wiring layers.

Further, the semiconductor package can enable mass production and improve productivity by performing a packaging process in a wafer state, thereby dramatically reducing a manufacture cost.

Further, the semiconductor package can easily form multilayer rearrangement wiring layers through the different bonded panel including the CCL.

As described above, in accordance with the method of manufacturing the semiconductor package of the present invention, it is possible to manufacture the semiconductor package only through the photo process without performing additional via hole forming process and layer stacking process by etching the metal layer to form the rearrangement wiring layer after forming the pad units on the metal layer through the different bonded panel including at least one metal layer and mounting the semiconductor chip electrically connected to the pad units, thereby simplifying the process and remarkably reducing a production cost.

Further, in accordance with the method of manufacturing the semiconductor package of the present invention, it is possible to prevent deterioration of the reliability due to misalignment by etching the metal layer to form the rearrangement wiring layer after mounting the semiconductor chip on the metal layer.

As described above, although the preferable embodiments of the present invention have been shown and described, it will be appreciated by those skilled in the art that substitutions, modifications and changes may be made in this embodiment without departing from the principles and spirit of the general inventive concept, the scope of which is defined in the appended claims and their equivalents.

What is claimed is:

1. A method of manufacturing a semiconductor package comprising:
   preparing a different bonded panel comprising a first metal layer and a second metal layer which is positioned on the first metal layer, an etching selection ratio of the second metal layer being different from an etching selection ratio of the first metal layer;
   forming a pad unit electrically connected to the first metal layer by etching the second metal layer;
   mounting a semiconductor chip over the different bonded panel to be electrically connected to the pad unit via soldering connection units;
   sealing the semiconductor chip;
   forming a rearrangement wiring layer by etching the first metal layer after sealing the semiconductor chip; and
   forming an external connection unit electrically connected to the rearrangement wiring layer, except at a vertically projected area of the soldering connection units.

2. The method of claim 1, wherein the different bonded panel further includes a wafer substrate positioned at a lower part of the first metal layer and the method further comprises removing the wafer substrate after the sealing the semiconductor chip.

3. The method of claim 2, wherein the forming the pad unit comprises using a vacuum deposition method or a plating method.

4. The method of claim 1, wherein the different bonded panel further includes a core layer positioned on the first metal layer and the second metal layer formed on the core layer and
   the method further includes forming a via to connect the second metal layer and the pad unit on the core layer after the sealing the semiconductor chip.

5. The method of claim 4, wherein the forming the pad unit comprises forming an additional rearrangement wiring layer.

6. The method of claim 1, further comprising forming an insulation pattern to expose a portion of the rearrangement wiring layer before the forming the external connection unit.

7. The method of claim 1, wherein the mounting the semiconductor chip comprises using soldering, conductive paste, NCP(Non-Conductive Paste) or ACF(Anisotropic Conductive Film).

8. The method of claim 1, wherein the different bonded panel further includes a wafer substrate positioned at a lower part of the first metal layer and the method comprises removing the wafer substrate during the sealing the semiconductor chip and the forming the rearrangement wiring layer.

9. The method of claim 4, further comprising forming a via hole on the core layer before the forming the rearrangement wiring layer; and
   forming a via filled in the via hole and electrically connected to the first metal layer.

10. A method of manufacturing a semiconductor package comprising:
    preparing a different bonded panel comprising a wafer substrate, a first metal layer, and a second metal layer which is positioned on the first metal layer, an etching selection ratio of the second metal layer being different from an etching selection ratio of the first metal layer;
    forming a pad unit on the first metal layer by etching the second metal layer;
    mounting a semiconductor chip to be connected to the pad unit via soldering connection units;
    sealing the semiconductor chip;
    removing the wafer substrate;
    forming a rearrangement wiring layer by etching the first metal layer after removing the wafer substrate; and
    forming an external connection unit electrically connected to the rearrangement wiring layer, except at a vertically projected area of the soldering connection units.

11. The method of claim 10, wherein the different bonded panel further includes a core layer positioned between the first metal layer and the second metal layer.

12. The method of claim 11, further comprising forming a via hole on the core layer before the forming the rearrangement wiring layer; and
    forming a via filled in the via hole and electrically connected to the first metal layer.

* * * * *